(12) United States Patent
Lee

(10) Patent No.: US 8,802,453 B2
(45) Date of Patent: Aug. 12, 2014

(54) PHASE CHANGE RANDOM ACCESS MEMORY AND METHOD FOR MANUFACTURING THE SAME

(71) Applicant: SK hynix Inc., Gyeonggi-do (KR)

(72) Inventor: Keun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/026,660

(22) Filed: Sep. 13, 2013

(65) Prior Publication Data

US 2014/0011335 A1    Jan. 9, 2014

Related U.S. Application Data

(62) Division of application No. 13/331,758, filed on Dec. 20, 2011, now Pat. No. 8,563,960.

(30) Foreign Application Priority Data

Sep. 26, 2011    (KR) .......................... 10-2011-0096810

(51) Int. Cl.
*H01L 21/02*    (2006.01)

(52) U.S. Cl.
USPC ...... 438/3; 438/5; 257/E21.09; 257/E27.004; 257/E29.017

(58) Field of Classification Search
USPC .......... 438/3–5, 9; 257/21.09, 27.004, 29.017
See application file for complete search history.

(56) References Cited

U.S. PATENT DOCUMENTS 8,563,960 B2 * 10/2013 Lee .................................. 257/3

* cited by examiner

*Primary Examiner* — Michael Lebentritt
(74) *Attorney, Agent, or Firm* — IP & T Group LLP

(57) ABSTRACT

A phase change random access memory includes a semiconductor substrate having a bottom electrode formed over the semiconductor substrate; and a phase change layer formed over the bottom electrode. The phase change layer a first phase change layer formed over the bottom electrode and including at least one of a first element, a second element, and a third element; and a second phase change layer formed over a surface of the first phase change layer and formed of the first element to prevent an area of the first phase change layer from increasing through diffusion.

13 Claims, 3 Drawing Sheets

FIG.2

| | First Phase Charge Layer | Second Phase Charge Layer |
|---|---|---|
| Single | Ge,Sb,Te | Ge |
| Binary | Ge(x)-Sb(1-x):x=0.1~0.9<br>Ge(x)-Te(1-x):x=0.5~0.9<br>Sb(x)-Te(1-x):x=0.4~0.9 | Ge(x)-Sb(1-x):x=0.1~0.9<br>Ge(x)-Te(1-x):x=0.5~0.9 |
| Ternary | Ge(x):0.01~0.5<br>Sb(y):0.1~0.9<br>Te(z):0.1~0.6 | Ge(x):0.01~0.5<br>Sb(y):0.1~0.9<br>Te(z):0.1~0.6 |

PHASE CHANGE RANDOM ACCESS MEMORY AND METHOD FOR MANUFACTURING THE SAME

CROSS-REFERENCES TO RELATED APPLICATION

This application is a division of U.S. patent application Ser. No. 13/331,758 filed on Dec. 20, 2011, which claims priority under 35 U.S.C. §119(a) to Korean application number 10-2011-0096810, filed on Sep. 26, 2011. The disclosure of each of the foregoing application is incorporated herein by reference in its entirety as set forth in full.

BACKGROUND

1. Technical Field

The present invention relates to a phase change random access memory (PRAM), and more particularly, to a phase change random access memory and a method for manufacturing the same.

2. Related Art

In general, a phase change random access memory (PRAM) stores data using a difference in resistance between an amorphous state and a crystalline state, by applying an electrical pulse to a phase change layer formed of a chalcogenide compound. The amorphous state of the phase change layer is obtained by applying a high current to increase the temperature of a phase change substance over a melting point and subsequently performing instant-cooling. The crystalline state of the phase change layer is obtained by generating a nucleus from applying low current in the amorphous state and undergoing a growing process.

Here, in the phase change random access memory, while change from the amorphous state into the crystalline state is easily implemented, change from the crystalline state into the amorphous state consumes large operating current.

In order to reduce operating current and improve reliability in the phase change random access memory, a method for forming a phase change layer as a confined structure may be used.

In forming the confined structure, a phase change area in the form of a hole is defined through a damascene process instead of etching, and a phase change substance is filled in the phase change area to increase phase change efficiency.

In using the confined structure, if phase change substances have uniform composition ratios in the hole, operating current increases since a phase change area is wide. In general, the phase change layer is filled through chemical vapor deposition (CVD) or atomic layer deposition (ALD). In this regard, since a process is performed at a relatively high temperature (around 300° C.), a phase change area is widened due to interatomic diffusion and chemical reaction, and operating current increases.

Also, as the degree of integration of a phase change random access memory increases, the distance between cells decreases and disturbance is caused due to heat so that the reliability of the phase change random access memory deteriorates.

SUMMARY

A phase change random access memory in which a phase change substance is embedded at a low temperature to reduce operating current and improve the reliability of a phase change random access memory and a method for manufacturing the same are described herein.

In one embodiment of the present invention, a phase change random access memory includes: a semiconductor substrate having a bottom electrode formed over the semiconductor substrate; w and a phase change layer formed over the bottom electrode, wherein the phase change layer includes a first phase change layer formed over the bottom electrode and including at least one of a first element, a second element, and a third element; and a second phase change layer formed over a surface of the first phase change layer and formed of the first element to prevent an area of the first phase change layer from increasing through diffusion.

In another embodiment of the present invention, a phase change random access memory includes: a semiconductor substrate having a bottom electrode formed over the semiconductor substrate; and a phase change layer formed over the bottom electrode, wherein the phase change layer includes a first phase change layer formed over the bottom electrode and including any one of a binary compound of a first element and a second element, a binary compound of the first element and a third element, and a binary compound of the second element and the third element; and a second phase change layer formed over a surface of the first phase change layer and including a binary compound of the first element and the second element or a binary compound of the first element and the third element, wherein the ratio of the first element in the second phase change layer is such that an area of the first phase change layer is prevented from increasing through diffusion.

In another embodiment of the present invention, a phase change random access memory includes: a semiconductor substrate having a bottom electrode formed over the semiconductor substrate; and a phase change layer formed over the bottom electrode, wherein the phase change layer includes a first phase change layer formed over the bottom electrode and including a ternary compound of a first element, a second element and a third element; and a second phase change layer formed over a surface of the first phase change layer and formed of a ternary compound of the first element, the second element and the third element, wherein the ratio of the first element is such that an area of the first phase change layer is prevented from increasing through diffusion.

In another embodiment of the present invention, a method for manufacturing a phase change random access memory includes: forming a bottom electrode over a semiconductor substrate; forming a first phase change layer over the bottom electrode using at least one of a first element, a second element, and a third element; and forming a second phase change layer over a surface of the first phase change layer using the first element.

In another embodiment of the present invention, a method for manufacturing a phase change random access memory includes: forming a bottom electrode over a semiconductor substrate; forming a first phase change layer over the bottom electrode using any one of a binary compound of a first element and a second element, a binary compound of the first element and a third element, and a binary compound of the second element and the third element; and forming a second phase change layer over a surface of the first phase change layer using a binary compound of the first element and the second element or a binary compound of the first element and the third element.

In another embodiment of the present invention, a method for manufacturing a phase change random access memory includes: forming a bottom electrode over a semiconductor substrate; forming a first phase change layer over the bottom electrode using a ternary compound of a first element, a second element and a third element; and forming a second phase change layer over a surface of the first phase change layer using a ternary compound of the first element, the second element and the third element.

BRIEF DESCRIPTION OF THE DRAWINGS

Features, aspects, and embodiments are described it conjunction with the attached drawings, in which:

FIG. 2 is a table showing composition ratios of phase change layers in the embodiment of the present invention.

DETAILED DESCRIPTION

Hereinafter, a phase change random access memory and a method for manufacturing the same according to the present invention will be described below with reference to the accompanying drawings through exemplary embodiments.

FIGS. 1A to 1D are views illustrating a method for manufacturing a phase change random access memory in accordance with an exemplary embodiment of the present invention, and FIG. 2 is a table showing composition ratios of phase change layers in the exemplary embodiment of the present invention.

Figure 1A:
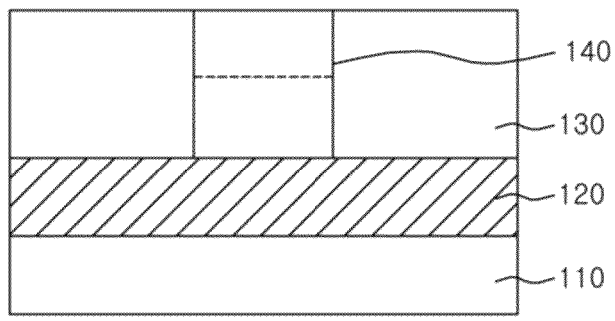
FIGS. 1A to 1D are views illustrating a method for manufacturing a phase change random access memory in accordance with an embodiment of the present invention.

Referring to FIG. 1A, in the phase change random access memory in accordance with the exemplary embodiment of the present invention, a junction region 120 serving as a word line is formed on a semiconductor substrate 110, and a switching element 140 is formed on the junction region 120. As the switching element 140, a diode may be used without a limiting sense, or a MOS transistor may be used. Reference character 130 denotes a first interlayer dielectric layer.

Figure 1B:
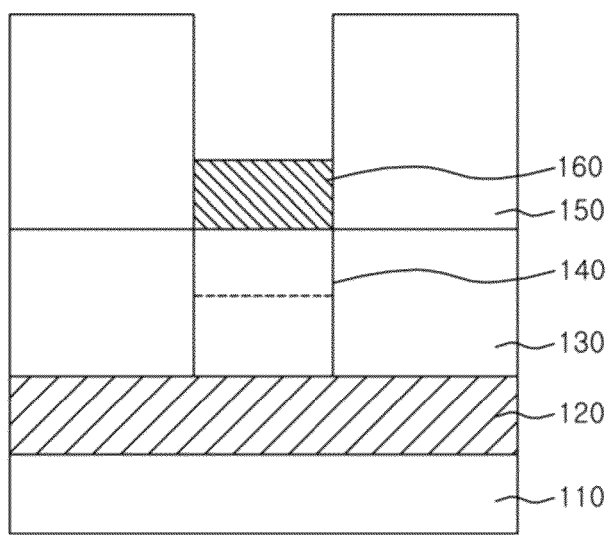

Referring to FIG. 1B, a second interlayer dielectric layer 150 is deposited on the switching element 140, and a hole is defined by etching the second interlayer dielectric layer 150. Thereafter, by filling and recessing titanium (Ti) or a titanium nitride (TiN) in the lower portion of the hole, a bottom electrode 150 is formed.

Figure 1C:
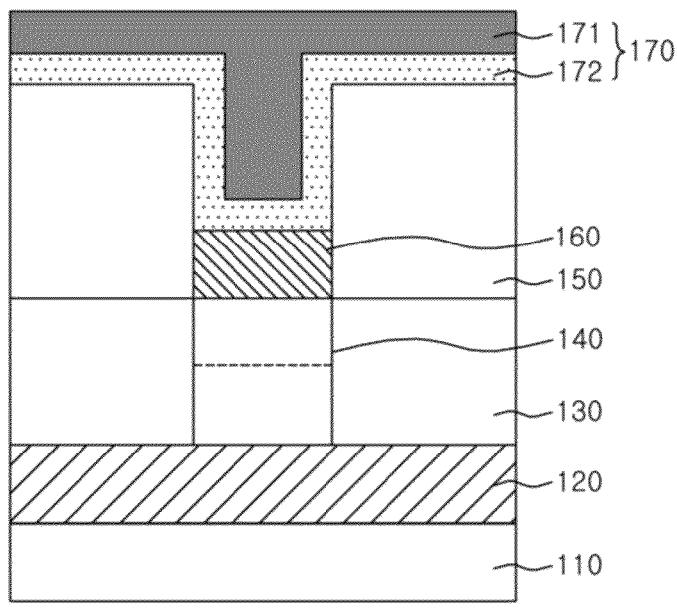

Referring to FIG. 1C, a phase change layer 170 constituted by germanium (Ge), antimony (Sb) and Tellurium (Te) is formed on the bottom electrode 160 formed as described above. In the phase change random access memory in accordance with the embodiment of the present invention, the phase change layer 170 may be constituted by a first phase change layer 171 and a second phase change layer 172. The first phase change layer 171 and the second phase change layer 172 are formed to have different composition ratios between elements of the layers.

The first phase change layer 171 serves as a programming volume for a memory. Here, a phase change substance of the first phase change layer 171 may be selected such that the first phase change layer 171 has a low melting point and possesses a composition ratio enabling easy transition from and to an amorphous state.

The second phase change layer 172 serves as a barrier region. Therefore, in order to prevent the first phase change layer 171 from spreading through diffusion by heat, a phase change substance of the second phase change layer 172 may be selected such that the second phase change layer 172 has a high melting point and possesses a composition ratio to result in a more difficult transition to and from an amorphous state and having low thermal conductivity. Referring to FIG. 2, it can be seen that a phase change substance for forming the second phase change layer 172 includes germanium (Ge). This is because germanium (Ge) has a low thermal conductivity among phase change substances.

Referring to FIG. 2, each of the first phase change layer 171 and the second phase change layer 172 may each be formed of, for example, only one phase change substance. For example, the first phase change layer 171 may be formed of any one of germanium (Ge), antimony (Sb) and Tellurium (Te), and the second phase change layer 172 may be formed of only germanium (Ge).

Further, each of the first phase change layer 171 and the second phase change layer 172 may be constituted by a binary compound, where the binary compound is formed of two phase change elements (that is, a first phase change element and a second phase change element). According to an example, the first phase change layer 171 may be formed of any one of germanium (Ge)-antimony (Sb), germanium (Ge)-Tellurium (Te) and antimony (Sb)-Tellurium (Te), and the second phase change layer 172 may be formed of any one of germanium (Ge)-antimony (Sb) and germanium (Ge)-Tellurium (Te). In the case where the binary compound of germanium (Ge)-antimony (Sb) is used, when germanium (Ge) has a composition ratio of 0.1 to 0.9 (that is, 10% to 90%) and antimony (Sb) has a composition ratio of (1-germanium (Ge)), and in the case where the binary compound of germanium (Ge)-Tellurium (Te) is used, when germanium (Ge) has a composition ratio of 0.5 to 0.9, tellurium (Te) has a composition ratio of (1-germanium (Ge)). In the case where the binary compound of antimony (Sb)-Tellurium (Te) is used, when antimony (Sb) has a composition ratio of 0.4 to 0.9, tellurium (Te) has a composition ratio of (1-antimony (Sb)). The composition ratio of germanium (Ge) may be set higher to ensure the characteristics of the second phase change layer 172.

Moreover, each of the first phase change layer 171 and the second phase change layer 172 may be constituted by a ternary compound. According to an example, each of the first phase change layer 171 and the second phase change layer 172 is formed of germanium (Ge)-antimony (Sb)-Tellurium (Te). In the composition ratio thereof, for example, when germanium (Ge) is set to 0.3 within a composition ratio of 0.01 to 0.5 used for germanium in the ternary compound, assuming that antimony (Sb) is set to 0.5 within a composition ratio of 0.1 to 0.9 used for antimony in the ternary compound, tellurium (Te) is set to 0.2 within a composition ratio of 0.1 to 0.6 used for tellurium in the ternary compound. In this way, the first phase change layer 171 and the second phase change layer 172 have different composition ratios.

The phase change layer 170 is filled through chemical vapor deposition (CVD) or atomic layer deposition (ALD). As a low temperature process under 200° C. is performed, the area of the first phase change layer 171, that is, the area of the memory volume, may be prevented from increasing, whereby operating current can be reduced and the reliability of a phase change random access memory can be increased by decreasing disturbance due to heat.

Figure 1D:
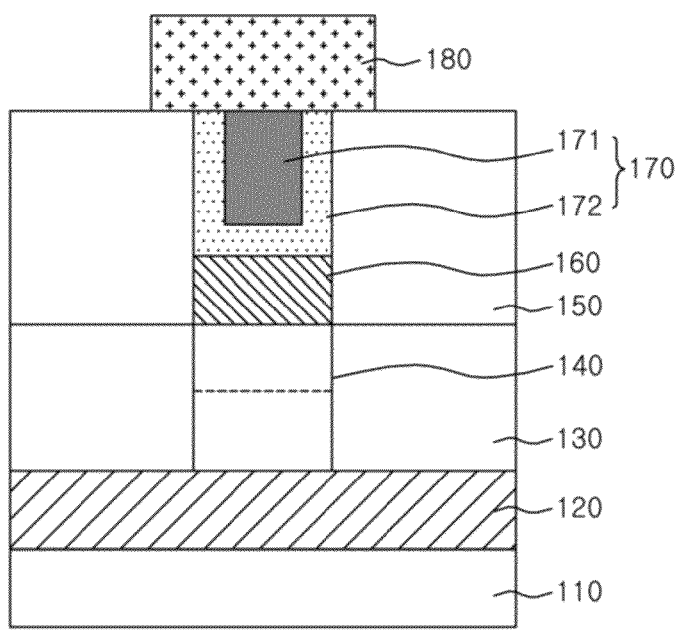

Referring to FIG. 1D, by planarizing or etching back the phase change layer 170 formed in this way, the phase change layer 170 is formed to have a confined structure.

A top electrode 180 is formed on the phase change layer 170 using titanium (Ti) or a titanium nitride (TIN).

By using the phase change random access memory and the method for manufacturing the same according to the embodiments of the present invention, the composition ratios of a phase change layer are set to prevent disturbance by heat and not to widen a phase change area (a programming random access memory area), whereby the reliability of a phase change random access memory can be increased.

While certain embodiments have been described above, they are exemplary only. Rather, the phase change random access memory and the method for manufacturing the same according to exemplary embodiments should include any other reasonably suitable embodiments that are consistent with the above-described features of the exemplary embodiments.

What is claimed is:

1. A method for manufacturing a phase change random access memory, comprising:
   forming a bottom electrode over a semiconductor substrate;
   forming a first phase change layer over the bottom electrode using at least one of a first element, a second element, and a third element; and
   forming a second phase change layer over a surface of the first phase change layer using the first element.

2. The method according to claim 1, wherein the first element is germanium (Ge), the second element is antimony (Sb) and the third element is tellurium (Te).

3. The method according to claim 1, wherein the first phase change layer and the second phase change layer are formed at a low temperature equal to or lower than 200° C.

4. A method for manufacturing a phase change random access memory, comprising:
   forming a bottom electrode over a semiconductor substrate;
   forming a first phase change layer over the bottom electrode using any one of a binary compound of a first element and a second element, a binary compound of the first element and a third element, and a binary compound of the second element and the third element; and
   forming a second phase change layer over a surface of the first phase change layer using a binary compound of the first element and the second element or a binary compound of the first element and the third element.

5. The method according to claim 4, wherein the first element is germanium (Ge), the second element is antimony (Sb) and the third element is tellurium (Te).

6. The method according to claim 4, wherein, when each of the first phase change layer and the second phase change layer is formed of the binary compound of the first element and the second element, the first element has a composition ratio of 0.1 to 0.9 in the phase change layer.

7. The method according to claim 4, wherein, when each of the first phase change layer and the second phase change layer is formed of the binary compound of the first element and the third element, the first element has a composition ratio of 0.5 to 0.9 in the phase change layer.

8. The method according to claim 4, wherein, when the first phase change layer is formed of the binary compound of the second element and the third element, the second element has a composition ratio of 0.4 to 0.9 in the first phase change layer.

9. The method according to claim 4, wherein the phase change layer is formed through chemical vapor deposition or atomic layer deposition.

10. The method according to claim 4, wherein the first phase change layer and the second phase change layer are formed at a low temperature equal to or lower than 200° C.

11. A method for manufacturing a phase change random access memory, comprising:
    forming a bottom electrode over a semiconductor substrate;
    forming a first phase change layer over the bottom electrode using a ternary compound of a first element, a second element and a third element; and
    forming a second phase change layer over a surface of the first phase change layer using a ternary compound of the first element, the second element and the third element.

12. The method according to claim 11, wherein the first element is germanium (Ge), the second element is antimony (Sb) and the third element is tellurium (Te).

13. The method according to claim 11, wherein, when each of the first phase change layer and the second phase change layer is formed of the ternary compound of the first element, the second element and the third element, the first element has a composition ratio of 0.01 to 0.5 in the phase change layer, the second element has a composition ratio of 0.1 to 0.9 in the phase change layer, and the third element has a composition ratio of 0.1 to 0.6 in the phase change layer.

* * * * *